(12) United States Patent
Guo et al.

(10) Patent No.: US 9,633,738 B1
(45) Date of Patent: Apr. 25, 2017

(54) ACCELERATED PHYSICAL SECURE ERASE

(71) Applicant: SanDisk Technologies LLC, Plano, TX (US)

(72) Inventors: Zelei Guo, San Jose, CA (US);
Pao-Ling Koh, Fremont, CA (US);
Henry Chin, Fremont, CA (US);
Pitamber Shukla, Milpitas, CA (US);
Deepak Raghu, San Jose, CA (US);
Dana Lee, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/195,583

(22) Filed: Jun. 28, 2016

(51) Int. Cl.
| | | |
|---|---|---|
| *G11C 16/04* | (2006.01) | |
| *G11C 16/16* | (2006.01) | |
| *G11C 16/10* | (2006.01) | |
| *G11C 16/30* | (2006.01) | |

(52) U.S. Cl.
CPC .............. *G11C 16/16* (2013.01); *G11C 16/10* (2013.01); *G11C 16/30* (2013.01)

(58) Field of Classification Search
CPC ...................................................... G11C 16/04
USPC ......................................... 365/185.01–185.33
See application file for complete search history.

(56) References Cited

U.S. PATENT DOCUMENTS

| | | | |
|---|---|---|---|
| 8,542,535 B2 | 9/2013 | Dutta et al. | |
| 8,885,420 B2 | 11/2014 | Oowada et al. | |
| 2002/0034099 A1* | 3/2002 | Ishii | G11C 16/0491 365/185.11 |
| 2002/0136056 A1* | 9/2002 | Ishii | G11C 16/0491 365/185.11 |
| 2002/0136057 A1* | 9/2002 | Akaogi | G11C 5/145 365/185.11 |
| 2003/0039139 A1* | 2/2003 | Akaogi | G11C 5/145 365/185.3 |

\* cited by examiner

*Primary Examiner* — Harry W Byrne
(74) *Attorney, Agent, or Firm* — Brinks Gilson & Lione

(57) ABSTRACT

A storage system includes a controller that is configured to make host data inaccessible. To do so, the controller may control power control circuitry to supply pulses to storage locations storing host data. The pulses may include flash write pulses but no erase pulses, or a combination of flash write pulses and erase pulses. If erase pulses are supplied, the number of the erase pulses may be less than the number supplied for performance of a default erase operation.

21 Claims, 11 Drawing Sheets

ACCELERATED PHYSICAL SECURE ERASE

BACKGROUND

A host system may send a secure erase command to a storage system when the host system wants host data being stored in the storage system to no longer be accessible. One way to respond to the secure erase command is for the storage system to delete address information managed by the storage system. This way, if the host system were to send a follow up read command to read certain data, the storage system would not know where that data is stored and thus not be able to provide the requested data back to the host system.

However, for some applications, merely deleting the address information may provide too low of a degree of inaccessibility because, even though the address information is deleted, the host data itself is still stored in the memory. One way to provide a higher degree of inaccessibility is to physically erase the data. However, erase operations are relatively time consuming. As such, ways to accelerate the execution of a secure erase operation while still providing a sufficiently high degree of data inaccessibility may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF THE PRESENTLY PREFERRED EMBODIMENTS

Overview

Figure 1A:
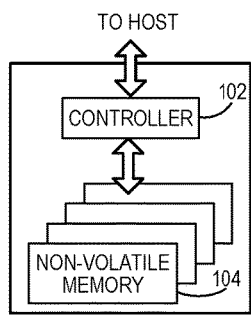
FIG. 1A is a block diagram of an exemplary non-volatile memory system.

Embodiments of the present invention are defined by the claims, and nothing in this section should be taken as a limitation on those claims.

By way of introduction, the following embodiments described accelerated physical secure erase operations. In one embodiment, a storage system includes a memory and power control circuitry. The power control circuitry, in order to execute a host command requesting host data to be inaccessible, is configured to: supply one or more flash write pulses to storage locations of the memory storing the host data without supply of one or more erase pulses to the storage locations; or supply a combination of one or more erase pulses and one or more flash write pulses to the storage locations, wherein a number of the one or more erase pulses is less than a number of erase pulses supplied for performance of a default erase operation in the storage system.

In some embodiments, when the power control circuitry is configured to supply the one or more flash write pulses without supply of the one or more erase pulses, a sole flash write pulse or an initial flash write pulse of the one or more flash write pulses is supplied at a higher magnitude than a magnitude of an initial write pulse that the power control circuitry is configured to supply for a regular program operation.

In some embodiments, when the power control circuitry is configured to supply the one or more flash write pulses without supply of the one or more erase pulses, the one or more flash write pulses comprises the sole flash write pulse.

In some embodiments, when the power control circuitry is configured to supply the combination of the one or more erase pulses and the one or more flash write pulses, at least one of: the one or more flash write pulses comprises a sole flash write pulse, or the one or more erase pulses comprises a sole erase pulse.

In some embodiments, both the one or more flash write pulses comprises the sole flash write pulse and the one or more erase pulses comprises the sole erase pulse.

In some embodiments, when the power control circuitry is configured to supply the combination of the one or more erase pulses and the one or more flash write pulses, a sole erase pulse or an initial erase pulse of the one or more erase pulses is supplied at a higher magnitude than a magnitude of an initial erase pulse that the power control circuitry is configured to supply for a default erase operation.

In some embodiments, the power control circuitry is configured to supply the one or more flash write pulses without supply of the one or more erase pulses on a block-by-block basis, or supply the combination of the one or more erase pulses and the one or more flash write pulses on a block-by-block basis.

In some embodiments, the power control circuitry is configured to supply the one or more flash write pulses without supply of the one or more erase pulses on a write all basis, or supply the combination of the one or more erase pulses and the one or more flash write pulses on an erase all basis and a write all basis, respectively.

In a second embodiment, a storage system includes a memory and power control circuitry. The power control circuitry is configured to perform a default erase operation and a secure erase operation on a single unit of erase of the memory. For performance of the default erase operation, the power control circuitry is configured to supply a default number of a plurality of erase pulses. For performance of the secure erase operation, the power control circuitry is configured to supply one or more secure erase pulses that comprises a fewer number of erase pulses than the default number of the plurality of erase pulses.

In some embodiments, the one or more secure erase pulses comprises a flash write pulse and no erase pulses.

In some embodiments, the flash write pulse has a higher magnitude than a magnitude of an initial write pulse that the power control circuitry is configured to supply for a regular program operation.

In some embodiments, the flash write pulse comprises a sole flash write pulse or an initial one of a plurality of flash write pulses.

In some embodiments, the one or more secure erase pulses comprises a combination of an erase pulse and a flash write pulse.

In some embodiments, the power control circuitry is configured to supply the erase pulse at a higher magnitude than a magnitude of an initial erase pulse of the plurality of erase pulses supplied for performance of the default erase operation, and the erase pulse is a sole erase pulse or an initial one of a plurality of erase pulses that the power control circuitry is configured to supply for performance of the secure erase operation.

In some embodiments, the power control circuitry is configured to perform the secure erase operation on a block-by-block basis.

In some embodiments, the power control circuitry is configured to perform the secure erase operation on an erase all basis and a write all basis.

In a third embodiment, a method of corrupting data in a storage system is performed. The method includes: determining, with a controller, to corrupt host data stored in a memory; and in response to the determination, issuing, with the controller, one or more commands to the memory to cause the memory to: perform a flash write operation on storage locations of the memory storing host data without performing an erase operation on the storage locations; or perform a combination of a flash write operation and a fast erase operation on the storage locations of the memory, wherein the fast erase operation comprises a supply of a fewer number of erase pulses than a number of erase pulses supplied for a default erase operation.

In some embodiments, the method further includes: receiving, with the controller, a host secure erase command from a host system; and selecting, with the controller, which of a plurality of different types of physical secure erase operations to perform based on information included in the host secure erase command.

In some embodiments, the method further includes: in response to the one or more commands: supplying, with power control circuitry, a single flash write pulse to each of a plurality of blocks on a die storing host data without supply any erase pulses to the plurality of blocks; or supplying, with the power control circuitry, a combination of a single flash write pulse and a single erase pulse to each of the plurality of blocks on the die storing host data.

In some embodiments, the method further includes: sending, with the controller, configuration data to the memory for storage in the memory after issuing the one or more commands to the memory.

In a fourth embodiment, a storage system includes: a memory; and means for performing a default erase operation and a secure erase operation on a single unit of erase of the memory, where the means supplies a default number of a plurality of erase pulses for performance of the default erase operation and supplies a fewer number of erase pulses than the default number of the plurality of erase pulses for performance of the secure erase operation.

Other embodiments are possible, and each of the embodiments can be used alone or together in combination. Accordingly, various embodiments will now be described with reference to the attached drawings.

Exemplary Embodiments

The following embodiments describe non-volatile memory systems and related methods of performing accelerated physical secure erase operations. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
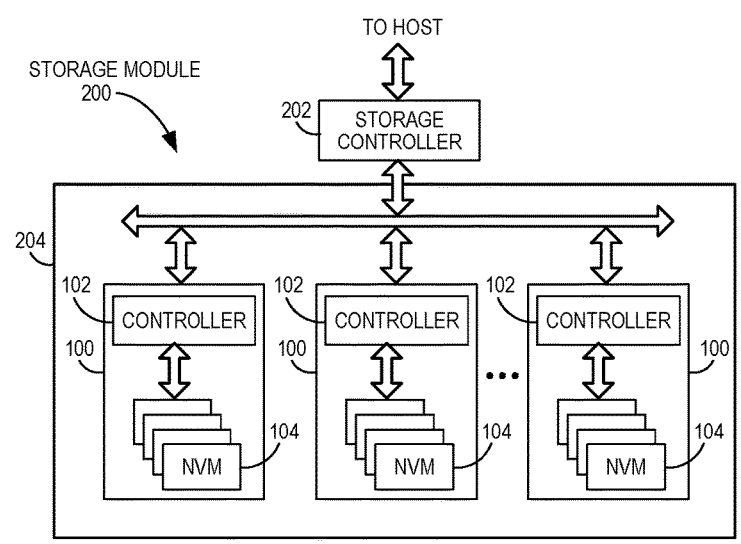
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
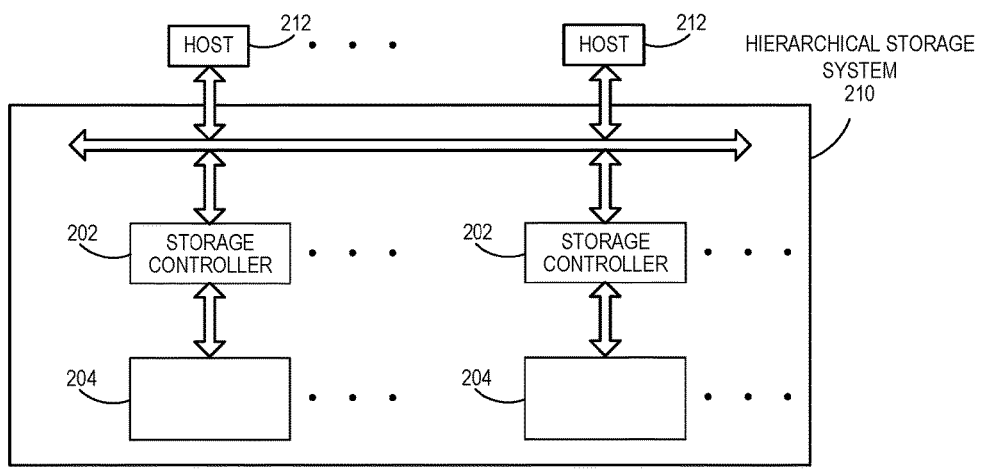
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
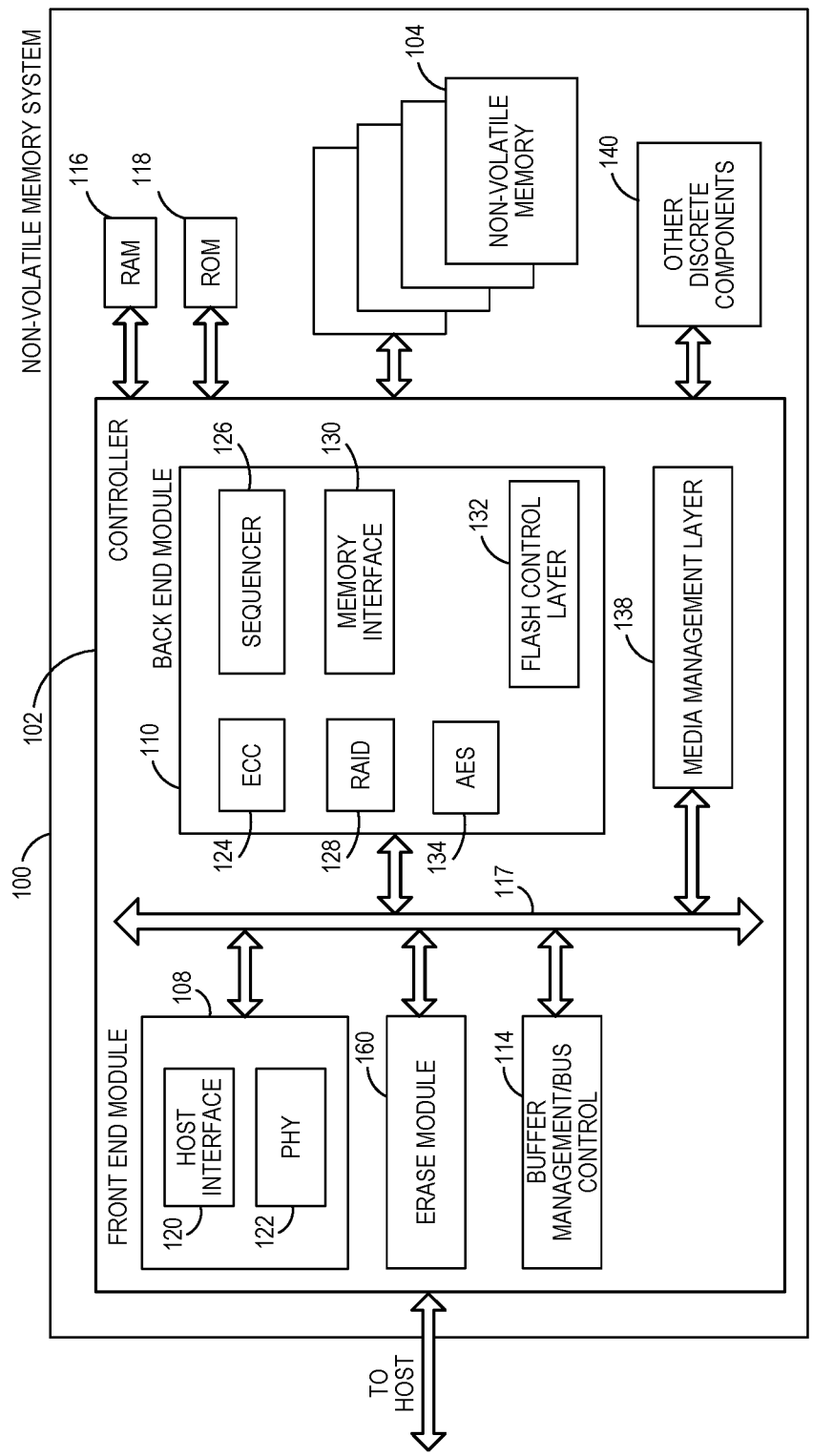
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Additional modules of the non-volatile memory system 100 illustrated in FIG. 2A may also include a cluster association recognition system 111, an address management module 160, and a data relocation module 162, as described in further detail below. These modules are shown as separate from the other modules of the non-volatile memory system 100, although in other configurations, one or more of them may be part of any of the other modules.

Figure 2B:
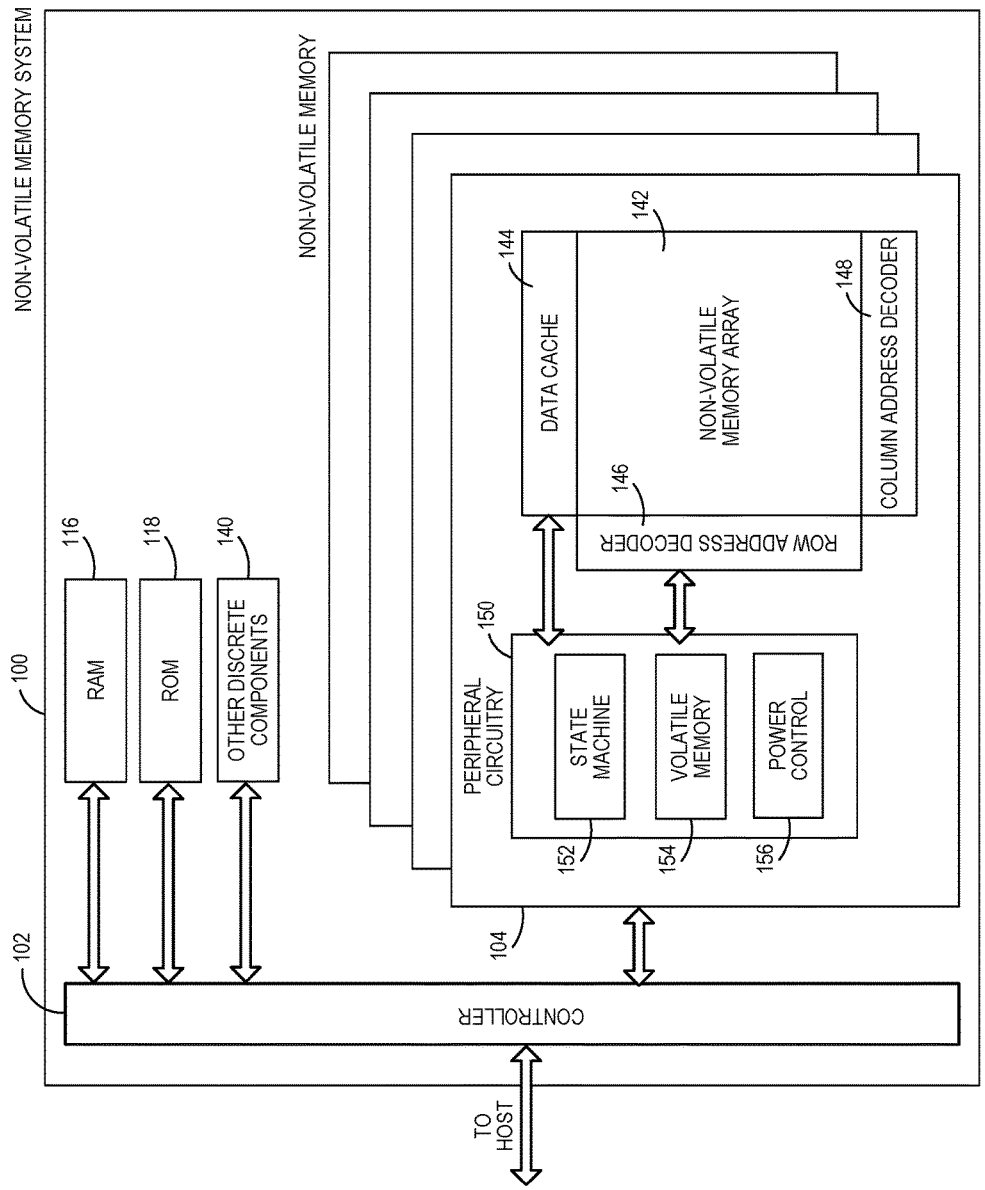
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell (e.g., two bits per cell, three bits per cell, four bits per cell, or more), or combinations thereof.

Additionally, a flash memory cell in the array 142 may include a floating gate transistor (FGT). Hereafter, FGT, storage element, memory element, and memory cell may be used interchangeably to refer to the same physical entity.

Figure 3:
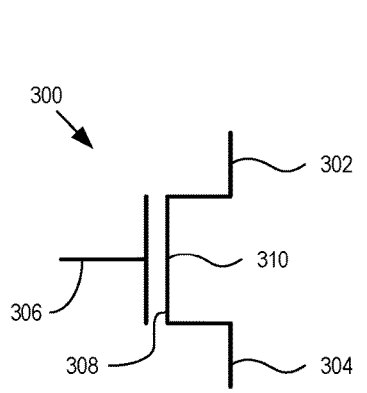
FIG. 3 is a circuit schematic diagram of an exemplary NAND-type flash memory array.

FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. That is, each FGT's threshold voltage may be indicative of the data stored in the memory cell. For example, when storing one bit of digital data, the range of possible threshold voltages of the storage element is divided into two ranges which are assigned logical data "1" and "0." In one example of a NAND type flash memory, the threshold voltage is negative after the storage element is erased, and defined as logic "1." The threshold voltage after a program operation is positive and defined as logic "0." When the threshold voltage is negative and a read is attempted, the storage element will turn on to indicate logic "1" is being stored. When the threshold voltage is positive and a read operation is attempted, the storage element will not turn on, which indicates that logic "0" is stored. Additionally, for configurations where the storage elements each store multiple levels of information, then the range of threshold voltage values may be divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltage values are used for the states of "10", "01", and "00." Similar threshold voltage ranges may be implemented for configurations where eight levels of information (three bits per cell), sixteen levels of information (four bits per cell), or more are being stored in the storage elements. The specific relationship between the data programmed into the storage element and the threshold voltage ranges of the storage element may depend upon the data encoding scheme adopted for the storage elements.

Figure 4:
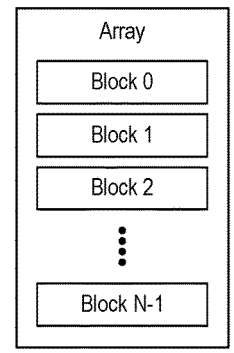
FIG. 4 is a block diagram of an example organizational arrangement or hierarchy of a memory array for flash memory.

The memory cells of a memory array 142 may be arranged or organized into an N-number of blocks, Block 0 to Block N–1, as shown in FIG. 4. In each of the blocks, the memory cells may be configured in a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together. Each of the blocks may also include wordlines and bitlines connected to the FGTs. Each page of FGTs is coupled to a word line. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 5:
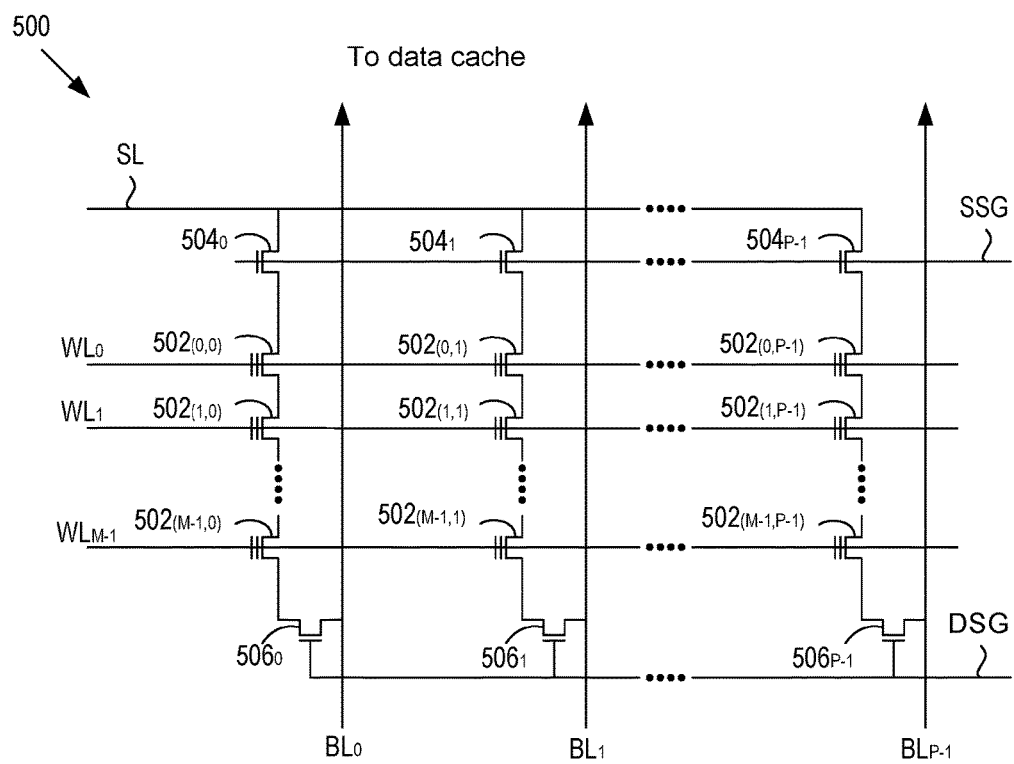
FIG. 5 is a schematic diagram of an example mapping between logical groups and metablocks.

FIG. 5 is a circuit schematic diagram of at block 500, which may be representative of one of the blocks in the memory array 142 shown in FIG. 4. The block 500 may include a P-number of bitlines $BL_0$ to $BL_{P-1}$ and a M-number of wordlines $WL_0$ to $WL_{M-1}$. In addition, the block 500 may include a P-number of strings of series-connected FGTs, each string being coupled to one of a P-number of bitlines $BL_1$ to $BL_{P-1}$, and an M-number of pages of FGTs, each page being coupled to one of the M-number of wordlines $WL_0$ to $WL_{M-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor 504, and may be coupled to its associated bitline BL via a drain select transistor 506. For example, a first string of FGTs $502_{(0,0)}$ to $502_{(M-1,0)}$ may be coupled to the source line SL via a source select transistor $504_0$ that is connected to the source line SL, and may be coupled to its associated bitline $BL_0$ via a drain select transistor $506_0$. The other strings may be similarly coupled. Switching of source select transistors $504_0$, $504_1$, . . . , $504_{P-1}$ may be controlled using a source select gate bias line SSG that supplies a source select gate bias voltage $V_{SSG}$ to turn on an off the source select transistors $504_0$, $504_1$, . . . , $504_{P-1}$. Additionally, switching of drain select transistors $506_0$, $506_1$, . . . , $506_{P-1}$ may be controlled using a drain select gate bias line DSG that supplies a drain select gate bias voltage $V_{DSG}$ to turn on and off the drain select transistors $506_0, 506_1, \ldots, 506_{P-1}$.

To program a memory cell, a program voltage is applied to the control gate of the storage element, and the bitline BL associated with the memory cell is grounded. Electrons from the channel are injected into the floating gate of the memory cell. Doing so may cause electrons to accumulate in the floating gate, which in turn may cause the floating gate to become negatively charged and the threshold voltage of the memory cell to be raised. To apply the program voltage to the control gate of the memory cell being programmed, the program voltage is applied on the wordline WL to which the memory cell is coupled. Application of the program voltage may include applying a series or sequence of programming voltage pulses to the control gate of the memory cell being programmed via the wordline WL. In some example configurations, the series of programming voltage pulses may have increasing magnitudes, starting with an initial pulse of the series having an initial program voltage magnitude. As discussed above, one memory cell in each of the strings share the same wordline WL.

Figure 6:
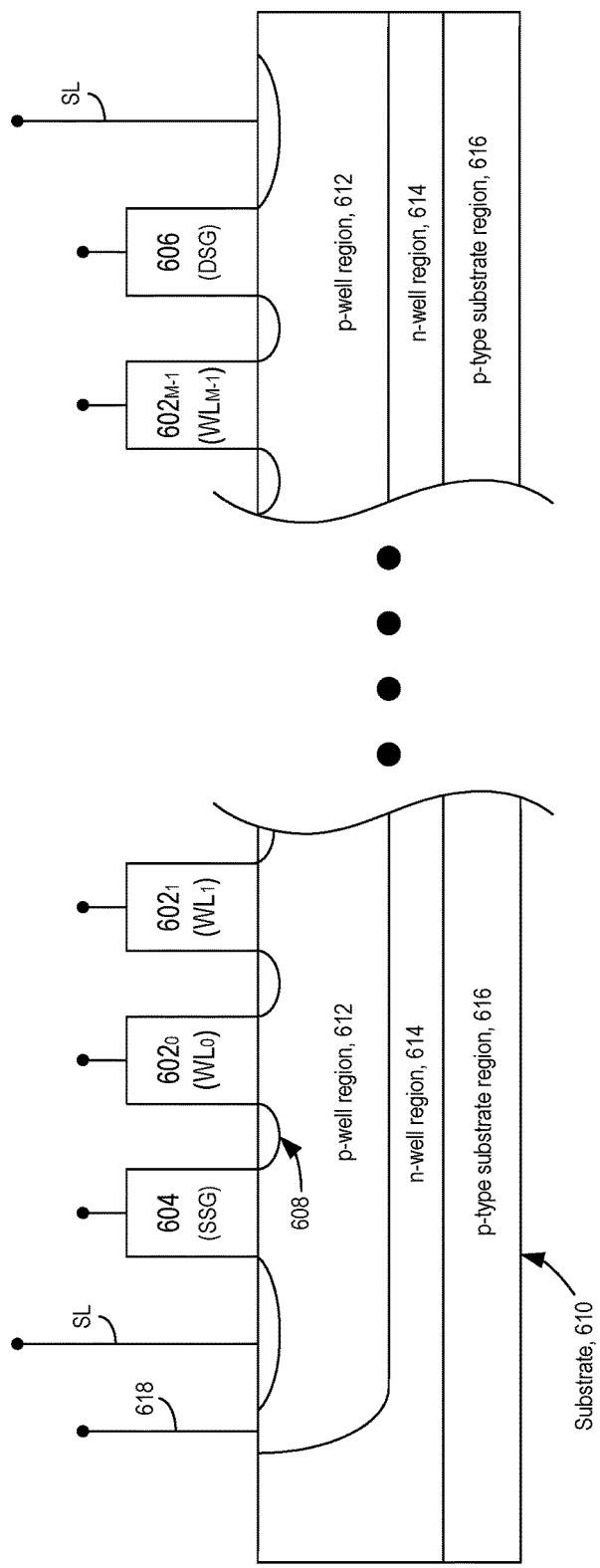
FIG. 6 is block diagram of an example cluster association recognition system of the non-volatile memory system of FIG. 2A.

FIG. 6 shows a cross-sectional view of a diagram of a string of FGTs used to illustrate an erase operation of a block. The string shown in FIG. 6 may be representative of one of the strings of the block 500 of FIG. 5. The string includes an M-number of FFTs $602_0$ to $602_{M-1}$ each coupled to one of an M-number of wordlines $WL_0$ to $WL_{M-1}$. For example, a first FFT $602_0$ is coupled to a first wordline $WL_0$, a second FFT $602_1$ is coupled to a second wordline $WL_1$, and an Mth FFT $602_{M-1}$ is coupled to a Mth wordline $WL_{M-1}$, as shown in FIG. 6. In addition, the string is coupled to (or alternatively is considered to include) a source select transistor 604 coupled to a source select gate bias line SSG and a drain select transistor 606 coupled to a drain select gate bias line DSG. Source/drain regions 608 may be provided on either side of each of the transistors 602, 604, 606. Also, the transistors 602, 604, 606 may be coupled to a supply line SL and a bitline BL. Additionally, the transistors 602, 604, 606 may be formed on a substrate 610. In an example configuration shown in FIG. 6, the substrate 610 may employ a triple-well technology that includes a p-well region 612 within an n-well region 614, which in turn is within a p-type substrate region 616.

To perform an erase operation on a block, the p-well region 612 may be raised to a high voltage, and each of the wordlines $WL_0$ to $WL_{M-1}$ may be biased to a low voltage (e.g., 0 volts). As a result, a strong electric is applied to tunnel oxide layers of the FFTs, causing electrons of the floating gates of the FFTs to be transferred or emitted to the p-well region 612, which in turn lowers the threshold voltages of the FFTs. Lowering the threshold voltages a level corresponding to an erase state configures the FFTs in the erase state. During an erase operation, the source line SL and the bitline BL may be floating. Additionally, to raise the voltage of the p-well region 612 to a high level, one or more erase voltage pulses may be applied to a terminal 618. In some example erase operations, if multiple erase voltage pulses are used, the magnitude of the pulses may increase from pulse to pulse. As described in further detail below, a single erase operation may be performed on an individual block, or on a plurality of blocks in a memory array.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102 as well as provide chip-level control of memory operations. The peripheral circuitry 150 may also include volatile memory 154. An example configuration of the volatile memory 154 may include latches, although other configurations are possible.

In addition, the peripheral circuitry 150 may include power control circuitry 156 that is configured to generate and supply voltages to the memory array 142, including voltages (including program voltage pulses) to the wordlines, erase voltages (including erase voltage pulses) to the terminal 618, the source select gate bias voltage $V_{SSG}$ to the source select gate bias line SSG, the drain select gate bias voltage $V_{DSG}$ to the drain select gate bias line DSG, as well as other voltages that may be supplied to the memory array 142. In one example configuration, the power control circuitry may include charge pumps to generate the voltages, although other configurations may be possible.

Figure 7:
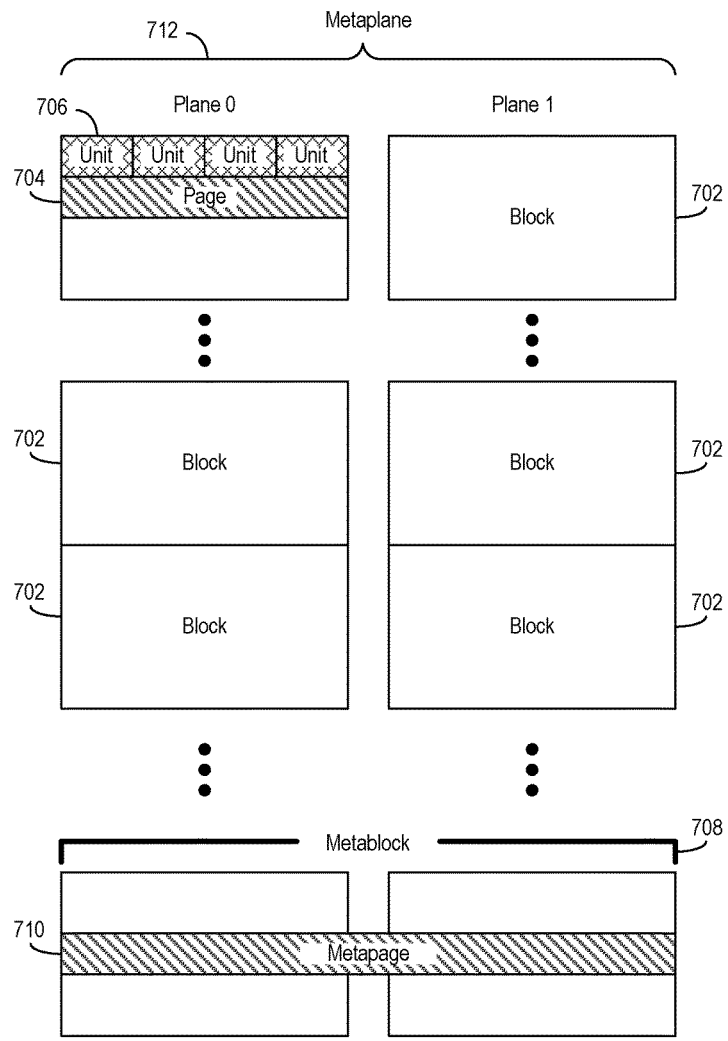
FIG. 7 is a schematic diagram of an example format of a cluster journal.

Referring to FIG. 7, the memory array 142 of a single memory die 104 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 7 is a block diagram of an example organizational arrangement or hierarchy of a memory array 142 for flash memory. As previously described, for flash memory, the memory cells may be divided or organized into blocks 702, and each block 702 may further be divided into a number of pages 704. Each block 702 may be a single unit of erase, or otherwise stated, contain the minimum number of memory elements that may be erased together during an erase operation. In addition, each page 704 may be a unit of sensing in the memory array 142. Each individual page 704 may further be divided into segments or units 706, with each segment or unit 706 containing the number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 704 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 702 may be configured. Generally, a plane includes a "column" of blocks 702, although other configurations may be possible. A single memory array 142 may include a single plane or multiple planes. The example arrangement shown in FIG. 7 includes two planes, Plane 0 and Plane 1. Data stored in different planes may be sensed simultaneously or independently.

Additionally, the organizational arrangement or hierarchy may identify abstract physical locations, including metablocks (or abstract blocks) 708, metapages (or abstract pages) 710, and metaplanes (or abstract planes) 712. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104. Additionally, the plane across which a metablock spans maybe referred to as a metaplane 712. In the example shown in FIG. 7, the metaplane 712 spans across Plane 0 and Plane 1.

In sum, the organizational arrangement for the memory dies 104 may include two sets of physical components—actual physical components or locations and abstract physical components or locations. The actual physical components and the abstract physical components may be mapped or correspond to each other. For example, a particular metablock 708 or metapage 710 may be mapped or correspond to a particular set of blocks 702 pages 704, respectively.

A host and the non-volatile memory system 100 may use different addressing schemes for managing the storage of data. For example, when a host wants to write data to the non-volatile memory system 100, the host may assign a host or logical address (also referred to as a logical block address (LBA)) to the data. Similarly, when the host wants to read data from the non-volatile memory system 100, the host may identify the data it wants read by the logical address. The host may utilize a host or logical addressing scheme in which a host file system maintains a logical address range for all LBAs assigned or recognized by the host. The logical addresses (LBAs) may be grouped into logical groups (LGs), which may further be divided or organized into units of logical sectors. For some examples, host read and write requests may be requests to read and write a segment comprising a string of logical sectors of data with contiguous addresses. In contrast to the host's logical addressing scheme, the non-volatile memory system 100, as previously described, may store and access data according to one or more physical addressing schemes that use physical addresses different from the logical addresses assigned by the host to store and access data.

To coordinate the host's logical addressing with the non-volatile memory system's physical addressing, the media management layer 138 (FIG. 2A) may map logical addresses to physical addresses for storage or retrieval of data. Then, when the non-volatile memory system 100 For some example configurations, the non-volatile memory system 100 may map host logical addresses to abstract physical addresses identifying abstract physical locations. In this way, logical groups and logical sectors of host logical addresses may be mapped or correspond to metablocks and physical sectors metablocks.

Figure 8:
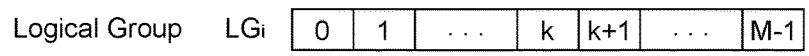
FIG. 8 is a schematic diagram of an example populated cluster journal.
Figure 8:
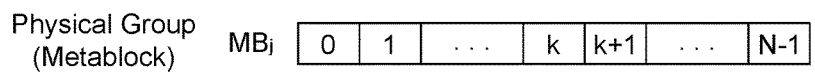
Figure 8:
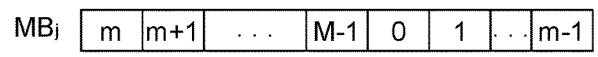

FIG. 8 shows a schematic diagram of an example mapping between an i-th logical groups ($LG_i$) and a j-th metablock ($MB_j$). A logical group may have an M-number of logical group sectors, and a metablock may have an N-number of physical sectors. In some example configurations, M and N may be the same such that there is a one-to-one correspondence between the logical sectors and the physical sectors, and one metablock of storage may store one logical group of data. In other example configurations, N may be greater than M such that multiple logical groups may correspond to a single metablock and one metablock of storage may store two or more logical groups of data.

Additionally, in some instances, the logical sectors of data may be stored in the physical sectors of storage in contiguous and sequential logical order, while in other instances, N logical sectors of data may be stored randomly or discontiguously in the physical sectors of a metablock. In addition, in some instances where data is stored contiguously, there may be an offset between the lowest address of a logical group and the lowest address of the metablock to which it is mapped. In that case, logical sector addresses may wrap around as a loop from the bottom back to the top of the logical group within the metablock. For example, as shown in the bottom diagram of FIG. 5, and assuming M and N are the same, a metablock $MB_j$ may store data associated with a logical sector m in its first physical sector 0. When the last logical sector M−1 is reached, the logical sectors may wrap around such that the first logical sector 0 is stored contiguously and sequentially after logical sector 0, and the logical sector m−1 is stored in the last physical sector N−1. A page tag may be used to identify any offset, such as by identifying the starting logical sector address of the data stored in the first physical sector of the metablock.

In other example configurations, the non-volatile memory system 100 may not utilize abstract physical addresses, and instead the host logical addresses may be directly mapped to the actual physical locations of the memory dies 104. For simplicity, and unless otherwise specified, the term physical address refers to an abstract physical address, an actual physical address, both, or some other type of physical address utilized by the memory system 100. In general, the non-volatile memory system 100 is configured to perform one or more address translations between the host logical addresses and the physical addresses based on mappings between the host logical addresses and the physical addresses in order to store, retrieve, or otherwise manage data in the non-volatile memory dies 104.

In order to keep track of where in the non-volatile memory system 100 data is stored, the non-volatile memory system 100 may maintain and manage a directory system or address mapping database that maps relationships or associations between host or logical addresses and physical addresses. The directory system may include one or more address data structures (such as tables, listings, logs, or databases as examples) that track and identify the logical-physical address relationships or mappings that the controller 102 may access to determine where in the non-volatile memory system 100 the most recent version of the data is stored.

The address mapping database may be configured in various ways to track or identify where data is stored. For example, the address mapping database may include a primary address data structure (also referred to as a Group Address Table (GAT)) that provides a primary logical-physical address mapping for logical addresses included in the logical address range recognized by the host. Various configurations of the mapping for the GAT are possible. In one example configuration for flash technology, the GAT keeps track of logical-physical address mapping between logical groups of logical sectors and corresponding metablocks. The GAT includes an entry for each logical group, ordered sequentially according to logical addresses. In addition, the GAT may be organized into a plurality of GAT pages, with each GAT page including entries identifying a metablock address for every logical group. For some example configurations, the address data structures may include at least one secondary address data structure in addition to the GAT. The at least one secondary address data structure may provide logical-physical address mapping for data fragments, may track changes or updates to where data is stored, or some combination thereof. One example secondary address data structure, referred to as GAT Delta, may track changes to entries and/or include a listing of changed entries in the mappings of the GAT. When data is re-written, the new version of the data may be written to another part of the non-volatile memory system 100, such as in an update block. GAT Delta may map data stored in the update blocks with associated logical groups. For some example configurations, GAT Delta may be part of a Master Index Page (MIP) that, in addition to GAT Delta, includes a Free Block List (FBL) and/or the GAT. The Free Block List may be a list that identifies blocks that are available for storage of data (e.g., for allocation as an update block) and that may be later mapped to logical groups. Other secondary address data structures may be possible.

Such primary and secondary address data structures are merely exemplary and other data structures may be possible. In general, the non-volatile memory system 100 may maintain at least one address data structure that associates host logical address information with physical address information.

The address mapping database may be stored in the non-volatile memory dies 104, the RAM 116, or a combination thereof. For example, some portions of the mapping database may be stored in the non-volatile memory dies 104 while other portions may be stored in the RAM 116. The portions may be stored in different locations of the non-volatile memory dies 104 and/or the RAM 116 at the same time or at different times during operation of the non-volatile memory system 104. In addition or alternatively, copies or different versions of the portions may be created and stored, permanently or temporarily, in the non-volatile memory dies 104 and/or the RAM 116. Various configurations for storing the address mapping database are possible.

Another aspect of the non-volatile memory system 100 is the ability to perform an initialization or configuration process that configures the non-volatile memory system 100 to become initialized or configured for communication with the host system, handle commands received from the host system, or otherwise be configured to perform its memory management operations. During the initialization process, the controller 102 may be configured to initialize one or more memory dies 104, such as by sending an initialization or power on reset (POR) command to the memory dies 104.

In addition, during the initialization process, the controller 102 may load configuration data stored in the non-volatile memory dies 104 into the RAM 116. In general, configuration data may include any data other than host data that the non-volatile memory system 100 may use in order to be able to operate. Otherwise stated, without the configuration data, the non-volatile memory system 100 may be unable to perform at least some of its functions. As examples, the configuration data may identify an interleave scheme for which data is programmed into the memory dies, a bad block list identifying which blocks are unusable, whether to enable wear leveling, whether to enable ECC, whether to enable on-chip or off-chip copying, what types of garbage collection or other background operations to perform and/or capacities at which to perform them, folding parameters, delay parameters between commands being issued, and dynamic read voltage levels, as non-limiting examples.

Additionally, the configuration data may include firmware or other executable data that enables the controller 102 to locate the address mapping database in the non-volatile memory dies 104 and load at least a portion of the address mapping database in the RAM 116. For some example configurations, when the address mapping database is loaded into the RAM 116, the media management layer module 138 of the controller 102 may learn or determine a die layout of the memory dies 104 (e.g., the number of dies, the size of the dies, which dies are located in which banks and/or chip enables, etc.), along with metablocks and their associated metablock addresses (numbers) and free blocks in a free block list. The configuration data may also include various other data used to initialize the non-volatile memory system 100, such as boot code stored in boot blocks and boot pages, firmware, file system maps, and log files, which may be stored in the non-volatile memory dies 104 and loaded into the RAM 116 by the controller 102 in order to initialize the non-volatile memory system 100.

Figure 9:
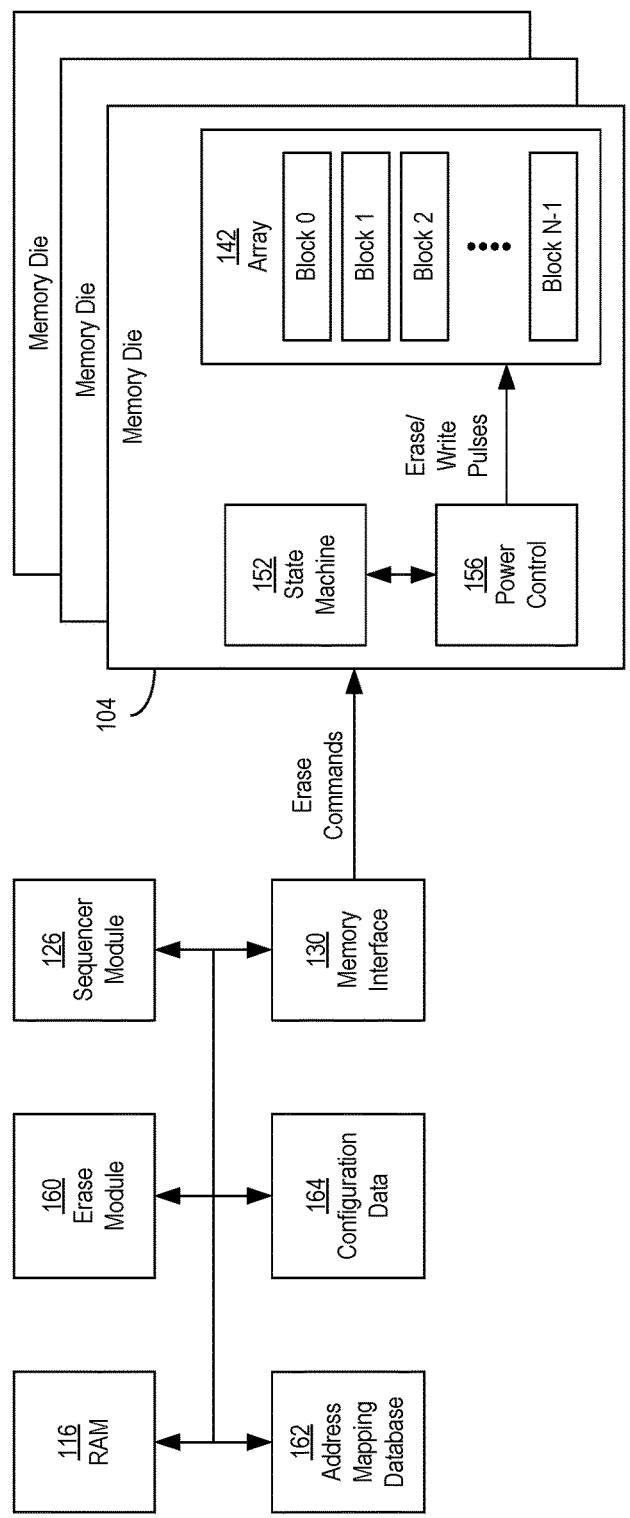
FIG. 9 is a schematic diagram of an example unfiltered cluster journal compilation and a corresponding initially filtered cluster journal compilation resulting from frequency counting.

As previously mentioned, erase operations may be performed on the memory dies 104. FIG. 9 shows components of the non-volatile memory system 100 that may be involved in performance of the erase operations. A shown in FIG. 9, the components may include the erase module 160, the RAM 116, the sequencer module 126, and the memory interface 130. Also shown in FIG. 9 is the address mapping database 162 and configuration data 164. During an erase operation, the address mapping database 162 may be stored in the RAM 116, stored in one or more blocks of the memory dies 104, or an initial version may be stored in the memory dies 104 while a copy or an updated version of at least a portion of the full address mapping database may be loaded in the RAM 116. Similarly, the configuration data 164 may be stored in the RAM, stored in one or more blocks of the memory dies 104, or both, such as by a copy of the configuration data 164 being loaded in the RAM 116.

In general, the erase module 160 may be configured to determine to perform an erase operation. As described in further detail below, the erase module 160 may be configured to determine a type of erase operation to perform. Also, if the erase operation is to be performed on only certain blocks of the memory dies 104, the erase module 160 may identify the storage locations that are to be subjected to the erase operation. The erase module 160 may notify the sequencer module 126 of the erase operation and provide the sequencer module 126 with the information the sequencer module 126 may need in order to have the erase operation performed, such as a type of erase operation and which storage locations are to be subjected to the erase operation. The sequencer module 126 may then generate one or more erase commands and, through the memory interface 130, issue the erase commands to the appropriate dies 104. In response to receipt of an erase command, a state machine 152 of a particular memory die 104 may control the power control circuitry 156 on the die 104 to generate one or more erase voltage pulses and supply the erase voltage pulses to the appropriate blocks of the die 104. Also, in some example configurations, the power control circuitry 156 may also supply one or more write pulses to the appropriate blocks, before or after the supply of the erase voltage pulses, as part of the erase operation.

The non-volatile memory system 100 may be configured to perform two types of erase operations: a normal or default erase operation, and a secure erase operation. A normal or default erase operation may, in general terms, be an erase operation other than a secure erase operation. The default erase operation may be performed in order to erase data being stored in one or more particular blocks or to configure one or more particular blocks in an erase state. Various kinds of triggering events may occur to cause the erase module 160 to perform a default erase operation. For example, the non-volatile memory system 100 may receive a host erase command indicating that the host wants erased certain data identified by host logical address information, and in response, the erase module 160 may perform a normal erase operation on the one or more blocks storing the data associated with the host logical address information. As another example, certain data may be obsolete due to a more recent version of the data being stored in a different storage location, and the erase module 160 may determine to erase the block storing the obsolete data in order to free up additional storage space, for example. As still another example, the controller 102 may determine that data being stored in one or more current blocks should be moved to a different location in the memory dies 104. One reason may be because the controller 102 may determine that the current blocks may or may soon be storing the data unreliably, such as due to a period of time elapsing, a number of program-erase cycles for the current blocks reaching a threshold count, a number of read operations performed on the current blocks reaching a threshold count, and/or a bit error rate associated with reading the data from the current blocks reaching a threshold level, as non-limiting examples. After the data is moved, the current blocks may be erased. Other triggering events for causing the erase module 160 to perform a default erase operation may be possible.

As previously described, in order to erase a block, power control circuitry 156 may supply one or more erase voltage pulses to a p-well region in order to lower the threshold voltages of the cells of the block being erased. For a default erase operation to be performed, the power control circuitry 156 may be configured to generate a predetermined number of erase voltage pulses. An example number may be in a range from five to twenty, although other numbers are possible. In general, the more pulses that are applied to a block, the lower the threshold voltages of the memory cells will drop toward the erase state. An initial pulse may have an initial voltage magnitude. In some example configurations, the magnitude of the pulses may increase with each subsequent pulse, although in other configurations, the magnitude may stay constant from pulse to pulse. The term default erase voltage pulse sequence may refer to a series or sequence of erase voltage pulses that the power control circuitry 156 generates and supplies to erase a block for a default erase operation, and may include or identify the number of pulses in the sequence as well as the characteristics of the pulses such as their voltage magnitudes, pulse widths, and/or frequency at which the pulses are supplied.

A secure erase operation may be an erase operation that causes host data (i.e., data that the host system has sent to the non-volatile memory system 100 for storage in the memory dies 104) to no longer be accessible by an external device, such as a host system. One way that host data may no longer be accessible is by being irretrievable. That is, if the host system issues one or more read commands to read the data, the non-volatile memory system 100 would be unable to retrieve the data and send it back to the host. Another way that the host data may no longer be accessible is by becoming corrupted. After data has become corrupted, if the data were to then be read or analyzed—such as by the controller 102, a host system, or some other external device reading the data stored in the memory dies 104—the data would be in a corrupted form such that it could not be converted back into its original form (e.g., its original bit sequence). Data that is fully corrupted may mean that for each of the bits in the data, there is no correlation between a bit's value (logic 1 or 0) before and after the data is corrupted. Corrupting the data may provide a higher degree of inaccessibility compared to only making it irretrievable. In some cases, a secure erase operation that corrupts data may be referred to as a physical secure erase.

In the most common situation, a secure erase operation is performed to make all host data stored in the memory dies 104 inaccessible. However, configurations where a secure erase operation is to be performed for only some of the host data being stored in the memory dies 104 to be inaccessible may be possible.

In some example configurations, the erase module 160 may be configured to determine to perform a secure erase operation in response to the non-volatile memory system 100 receiving a secure erase command from the host, such as via the front end module 108. For example, a host may determine that it wants the host data being stored in the non-volatile memory system 100 to be inaccessible, and in response send a secure erase command to the non-volatile memory system 100. For other configurations, the erase module 160 may determine to perform a secure erase operation without receipt of a host secure erase command, such as in response to detection of an internal triggering event that is internal to the non-volatile memory system 100.

The non-volatile memory system 100 may be configured to perform one or more of a plurality of types of secure erase operations. One type of secure erase operation is a non-physical secure erase operation that makes the host data irretrievable in response to host read commands, but without corrupting the host data. Instead, the erase module 160 may cause the sequencer module 126 to issue one or more erase commands to the memory dies 104 to erase the address mapping database 162 being stored in the memory dies 104. Any version or portion of the address mapping database 162 stored in the RAM 116 may also be deleted. Subsequently, if the controller 102 receives a host read command from the host system, the controller 102 may not be able to determine where the data is located in the memory dies 104, and as such, may not be able to return the requested data to the host system.

In some example situations or applications, the non-physical secure erase operation may provide too low of a degree of inaccessibility since the host data itself is still being stored in an uncorrupted form in the memory dies 104. The following describes five types of physical secure erase operations that, in addition or alternatively to erasing the addressing mapping database 162, corrupts the host data so that the host data itself is, at least to some degree, unidentifiable or indecipherable.

In a first-type physical secure erase operation, a default erase operation may be performed in which the power control circuitry 156 may supply a default erase voltage pulse sequence to each block subjected to the physical secure erase operation. Following the default erase voltage pulse sequence, a default flash write operation may be performed in which the power control circuitry 156 may supply a default flash write voltage pulse to all of the wordlines of the block. The magnitude of the default flash write voltage pulse may be equal to the magnitude of the initial pulse of the series of voltage pulses that the power control circuitry 156 is configured to supply to perform a regular program operation to the block. In contrast to a regular program operation, there is no associated data (e.g., host data) being written to the block during the default flash write operation. The effect of supplying the default flash write voltage pulse sequence to the wordlines of the block is to raise the threshold voltages of the memory cells in the block, especially those in the erase state. Performing the default flash write operation on a block following performance of a default erase operation may add another act of corruption to the memory cells in the block. That is, first, the threshold voltages of the cells are lowered in response to the default erase voltage pulse sequence. Subsequently, the threshold voltages are raised in response to the default flash write operation. Additionally, in some applications, performing a default flash write operation to configure the memory cells away from the erase state may configure the block in a more stable state compared to the erase state.

Executing the first-type physical secure erase operation may be performed on a block-by-block basis for each of the memory dies 104. To do so, the erase module 160, through the sequencer module 126 and the memory interface 130, may issue block erase commands and default flash write commands to the dies 104 for each of the blocks subjected to the physical secure erase operation. In some example configurations, the block erase and default flash write commands may be separate, while in other example configurations they may be a single command. After the first-type physical secure erase operation is performed on one block in a die 104, the erase module 160 may issue a block erase command and a default flash write command for another or next block in the die 104.

Performing a physical secure erase operation on a block-by-block basis may be in contrast to performing an "erase all" physical secure erase operation in which the state machine 152 may control the power control circuitry 156 to perform a physical secure erase operation on all of the blocks of a die in response to an "erase all" physical secure erase command received from the controller 102. For at least some of the dies 104, one or more of the blocks may be storing configuration data. Since it may be desirable to keep the non-volatile memory system 100 operable after performing a physical secure erase operation, it may, in turn, be desirable to keep the configuration data stored in the non-volatile memory system 100 following the physical secure erase operation. One way to do so is to perform the physical secure erase operation on a block-by-block basis such that the blocks storing the configuration data are avoided. As a result, blocks storing host data may be subjected to the secure physical erase operation while blocks storing configuration data may not be. In contrast, if an "erase all" physical secure erase command is issued to a die, then all of the blocks, including those storing the configuration data, may be subjected to the physical secure erase operation.

The first-type physical secure erase operation may provide a relatively strong or high degree of data corruption since the plurality of erase pulses in the default erase pulse sequence may sufficiently drive the threshold voltages down to the erase state. Additionally, as mentioned, the subsequent default flash operation may raise the threshold voltages, adding another act of corruption. The end result may configure the memory cells to have a zero percent correlation between the bit values they were storing before and after the first-type physical secure erase operation. However, the default erase operation may be relatively time consuming due the number of pulses in the default erase pulse sequence. For example, performing a first-type physical secure erase operation on a one terabyte (1 TB) memory drive may take around 60 seconds.

The following second-type, third-type, fourth-type, and fifth-type physical secure erase operations may be significantly faster to complete while providing comparable or slightly lower but acceptable degrees of data corruption.

The second-type physical secure erase operation may not include an erase operation. Instead, only a flash write operation is performed on the blocks storing host data. In some example configurations, a single or sole flash write voltage pulse is used for the flash write operation, although in other configurations, more than one pulse may be used. The flash write operation that is performed for the second-type physical secure erase operation may be a default flash write operation in that the flash write voltage pulse (or the initial flash write voltage pulse if multiple pulses are supplied) has a magnitude equal to the magnitude of the initial pulse for a regular program operation. In other example configurations, the magnitude may be at a higher predetermined level than magnitude of the initial pulse for a regular program operation. In some example configurations, the higher magnitude may be in a range of 20-30% higher. For example, an initial program voltage may be 10 V, and the higher voltage may be 12 V or 13 V. However, these voltage levels are merely exemplary, and other voltage levels may be used. A flash write operation where the magnitude of the (initial) flash write voltage pulse is higher than the magnitude of the initial pulse for a regular program operation may be referred to as an elevated flash write operation. Additionally, like the first-type physical secure erase operation, the second-type physical secure erase operation may be performed on a block-by-block basis, corrupting the blocks storing host data and avoiding corrupting blocks storing configuration data.

Prior to performing a physical secure operation in a block storing host data, a certain percentage of the memory cells in a block may be in an erase state, while another percentage of the memory cells may be in one or more program states (states above the erase state). The percentages may depend on the storage density (bits per cell) of the block. Performing a flash write operation on a block without first erasing the block may have the effect of raising the threshold voltages of the memory cells so that a smaller percentage of the memory cells are in the erase state prior to the flash write operation. The higher magnitude used for the flash write voltage pulse of the elevated flash write operation may have the effect of raising the threshold voltages of the memory cells higher compared to the default level of the flash write voltage pulse of the default flash write operation. As a result, a larger percentage of the memory cells initially in the erase state may be raised above the erase state when an elevated flash write operation is performed compared to when a default flash write operation is performed. The larger the number of memory cells initially in the erase state that are raised above the erase state may correspond to a larger degree of corruption to the memory cells. Accordingly, in some applications, it may be more desirable to perform an elevated flash write operation than a default flash write operation for the second-type physical secure erase operation.

Because an erase operation is not performed for the second-type physical secure erase operation, the latency provided by the erase operation may be eliminated. For some memory applications, performing the second-type physical secure erase operation on a 1 TB memory drive may take about three seconds, which is substantially less than the 60 second time period that the first-type physical secure erase operation takes to be executed. However, without an erase operation being performed, the second-type physical secure erase operation may provide a lower degree of corruption compared to the first-type physical secure erase operation, since only a single act of corruption is being performed. While the flash write operation (default or elevated) may raise a certain percentage of the memory cells in the erase state to a state above the erase state, the cells already above the erase state (i.e., in a program state) may be largely unaffected by the flash write operation. Accordingly, after the flash write operation, at least some degree of correlation may exist between the bit levels of the memory cells before and after the second-type physical erase operation is performed. However, for at least some secure erase applications, the degree of corruption may be considered satisfactory or sufficient.

The third-type physical erase operation may perform a fast erase operation and a flash write operation. A fast erase operation may be performed by supplying a fewer number of erase voltage pulses than the number of pulses supplied for the default erase operation. In some example configurations, a single or sole erase voltage pulse may be supplied for performance of the fast erase operation. By supplying a fewer number of erase voltage pulses, the fast erase operation may be performed faster than the default erase operation. Also, in further comparison with the default erase operation, the magnitude of the sole erase voltage pulse (or the initial erase voltage pulse if multiple pulses are supplied), may be the same as or higher than the magnitude of the initial voltage pulse of the default erase voltage pulse sequence. For the third-type physical secure erase operation, after the fast erase operation is performed on a block, a flash write operation may be performed on the block. The flash write operation may be either a default flash write operation or an elevated flash write operation. Because both the fast erase operation and the flash write operation are performed, the third-type physical secure erase operation may provide two acts of data corruption and, in turn, a comparable degree of data corruption as the first-type physical secure erase operation. However, as mentioned, because fewer erase voltage pulses are supplied during the erase operation, the third-type physical secure erase operation may be performed faster than the first-type physical secure erase operation. For some memory applications, performing the third-type physical secure erase operation on a 1 TB memory drive may take about nine seconds. Also, like the first-type physical secure erase operation, the third-type physical secure erase operation may be performed on a block-by-block basis, corrupting the blocks storing host data and avoiding the blocks storing configuration data.

The fourth-type physical secure erase operation may be similar to the third-type physical secure erase operation, except that the flash write operation may be performed first and the fast erase operation may be performed second. Because the fast erase and flash write operations are simply reversed, the time the fourth-type physical secure erase operation takes to be completed (i.e., the latency involved in completing the operation) may be the same as the time the third-type physical secure erase operation takes.

Whether it is desirable for the non-volatile memory system 100 to perform the third-type physical secure erase operation or the fourth-type physical secure erase operation may depend on the behavior of the memory cells of the non-volatile memory dies 104. For example, as previously described, the threshold voltages of the memory cells may increase in response to flash write voltage pulses being supplied and decrease in response to erase voltage pulses being supplied. How much the threshold voltage for a memory cell changes (e.g., on average) in response to a single erase voltage pulse compared to in response to a single or sole flash write voltage pulse may determine whether the third-type or the fourth-type physical secure erase operation is preferred. In particular, if the change in threshold voltage is greater in response to an erase voltage pulse than in response to a flash write voltage pulse i.e., if the decrease in the threshold voltage is greater when an erase voltage pulse is supplied than the increase in threshold voltage when a flash write voltage pulse is supplied, then the third type-physical secure erase operation may be preferred over the fourth-type physical secure erase operation. Alternatively, if the increase is greater than the decrease, then the fourth-type may be preferred. Which of the two operations provides a greater change in threshold voltage may be considered the stronger of the two operations. In general, it may be desirable to perform the stronger of the two operations first and then the weaker operation. During manufacture or an initial configuration of the non-volatile memory system 100, a memory characterization process may be performed to determine whether the fast erase operation or the flash write operation is the stronger operation. The process, in turn, may determine whether the non-volatile memory system 100 performs, or at least whether it is preferable for the non-volatile memory system 100 to perform, the third-type instead of the fourth-type or vice versa.

The fifth-type physical secure erase operation may utilize "erase all" and "write all" erase and flash write operations. As previously described, an erase operation may be performed on a die on a block-by-block basis or on an "erase all" basis. For an erase operation to be performed on a block-by-block basis, the controller 102 may issue an erase command to the dies 104 for each of the blocks, or at least in a way that identifies the specific blocks to be erased. Which blocks on a die 104 that the state machine 152 and power control circuitry 156 erase may depend on the blocks identified in the erase commands received from the controller 102. In contrast, when the controller 102 issues an "erase all" command to a die 104, the state machine 152 and power control circuitry 156 may respond by performing an erase operation on all of the blocks of the die 104. Doing so, however, may erase one or more blocks on the die 104 storing configuration data, as previously described.

Similar to an "erase all" command, a flash write operation may be performed on a "write all" basis rather than a block-by-block basis. In response to a "write all" flash write command from the controller 102, the state machine 152 and the power control circuitry 156 may perform a flash write operation on all of the blocks of the die 104, including the blocks storing configuration data. The "write all" flash write operation may be either a default "write all" flash operation in which the default flash write operation is applied to all of the blocks of the die 104, or an elevated "write all" flash operation in which the elevated flash write operation is applied to all of the blocks of the die 104.

The fifth-type physical secure erase operation may include performance of any of the first-type, second-type, third-type, or fourth-type physical secure erase operations, as previously described. However, for the fifth-type, instead of the erase and flash write operations being performed on a block-by-block basis, the erase operation may be performed on an "erase all" basis and the flash write operation may be performed on a "write all" basis.

After the "write all" flash write operation is performed or a combination of a "write all" flash write operation and an "erase all" erase operation is performed, the blocks originally storing configuration data may be corrupted. Referring to FIG. 9, in order for the non-volatile memory system 100 to be operable after the configuration data stored in the blocks of the dies 104 is corrupted, the configuration data 162 may be loaded into the RAM 116 before the "write all" flash write or the combination of "write all" flash write and "erase all" erase operations are performed. Before issuing the "write all" and "erase all" commands to a die 104, the controller 102 may check that the configuration data stored on that die 104 is in the RAM 116. If not, the controller 102 may issue appropriate read commands to the die 104 to have the configuration data from that die 104 loaded into the RAM 116. After the "write all" flash write or the combination of "write all" flash write and "erase all" erase operations are performed, the configuration data 162 loaded in the RAM 116 may then be programmed into the dies 104. As a result, the non-volatile memory system 100 may remain operable following performance of the fifth-type physical secure erase operation despite the configuration data being stored on the dies 104 being corrupted as a result of the fifth-type physical secure erase operation.

The fifth-type physical secure erase operation may be the fastest of the five types of physical secure erase operations for corrupting data. For example, corrupting data by performing an "erase all" fast erase operation followed by a "write all" default flash write operation may take less than one second to perform. Additionally, a total time to complete the fifth-type physical secure erase operation by programming the configuration data 162 back into the memory dies 104 in addition to performing the "erase all" and "write all" operations may take about 60 seconds for a 1 TB memory drive. However, performance of the fifth-type physical secure erase operation may also include a risk of the non-volatile memory system 100 becoming dysfunctional or inoperable. In particular, if the non-volatile memory system 100 experiences a power loss while the fifth-type physical secure erase operation is being performed, the configuration data 162 may not be programmed back into the memory dies 104 and the configuration data 162 being stored in the RAM 116 will be lost. As a result, the non-volatile memory system 100 will be rendered dysfunctional or inoperable.

The non-volatile memory system 100 may be configured to perform one or more of the five types of physical secure erase operations. In some example configurations, the host system may send a host physical secure erase command to cause the non-volatile memory system 100 to perform a physical secure erase operation. The host command may include information that identifies which of the five types of physical secure erase operations it wants the non-volatile memory system 100 to perform. In response, the non-volatile memory system 100 may perform the specified or indicated type.

In some example configurations, the host physical secure erase command may expressly specify the type of physical secure erase command, such as with a unique identifier that uniquely identifies the type. For other configurations, the host physical secure erase command may identify one or more performance criteria associated with the physical secure erase commands, and the erase module 160 may select the optimal physical secure erase type for achieving the performance criteria. Example performance criteria may include level of data corruption, latency (time taken to perform the physical secure erase operation), risk of rendering the non-volatile memory system 100 inoperable, and power consumption.

For one non-limiting example, if the information indicates that the host wants corruption performed as fast as possible, as high of a level of data corruption as possible while corrupting the data as fast as possible, with minimal power consumption, and without regard for whether the system 100 becomes inoperable, the erase module 160 may determine to perform the fifth-type secure erase module and perform both an "erase all" fast erase operation and a "write all" default flash write operation, since that type may be the most optimal for meeting the specified criteria. As another example, if the information indicates that the host wants corruption performed as fast as possible, the level of data corruption is not critical, power consumption does not have to be minimized, and the host does not want to risk the system 100 becoming inoperable, then the erase module 160 may determine to perform the second-type physical secure erase operation at elevated levels, since the second type may be most optimal for meeting the specified criteria.

Figure 10:
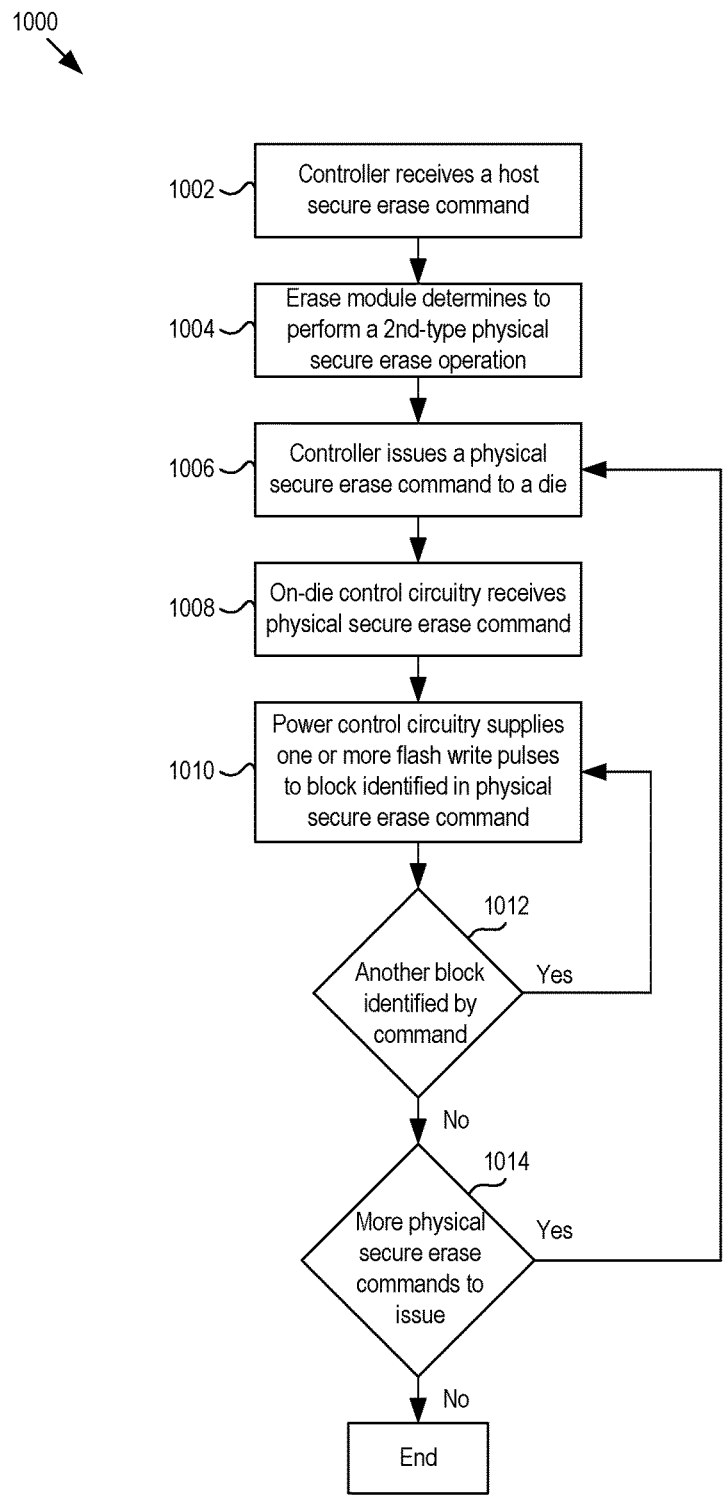
FIG. 10 is a flow chart of an example method of identifying sequences of clusters.

FIG. 10 shows a flow chart of an example method 1000 of performing the second-type physical secure erase operation on a memory die of a non-volatile memory system, such as the non-volatile memory system described with reference to FIGS. 1-9. Although the method 1000 is described for one die, similar methods can be performed for multiple dies. At block 1002, a controller of the non-volatile memory system may receive a host secure erase command from a host system. At block 1004, the controller, such as an erase module of the controller, may determine to perform the second-type physical secure erase operation. At block 1006, the controller, such as with the erase module, a sequencer module, and a memory interface module, may issue a physical secure erase command to the die. The physical secure erase command may indicate to control circuitry, such as a state machine, of the die to perform the second-type physical secure erase operation. The physical secure erase command may also identify one or more blocks on which to perform the second-type physical secure erase operation. The one or more blocks may be storing host data.

At block 1008, the control circuitry may receive the physical secure erase command from the controller. At block 1010, power control circuitry may supply one or more flash write voltage pulses to the wordlines of a block of the one or more blocks identified in the physical secure erase command, such as by being controlled by the control circuitry in response to receipt of the physical secure erase command. In some example methods, the one or more flash write voltage pulses may be a single flash write voltage pulse. In other example methods, the one or more flash write voltage pulses may include a plurality of flash write voltage pulses. Whether a single flash write voltage pulse or multiple flash write voltage pulses are supplied, the number of pulses may be less than the number of pulses supplied to program data during a regular program operation. In addition, in some example methods, the magnitude of the single flash write voltage pulse (or the initial pulse if multiple flash write voltage pulses are supplied) may be the same as the magnitude of the initial voltage pulse of a regular program operation. In other example methods, the magnitude of the single or initial voltage pulse may be greater than the magnitude of the initial voltage pulse of a regular program operation. Further, the power control circuitry may supply the one or more flash write voltage pulses to the wordlines of the block without the power control circuitry first having supplied one or more erase voltage pulses to erase host data being stored in the block.

At block 1012, after the power control circuitry supplies the one or more flash write voltage pulses to the block, if there is another block identified in the physical secure erase command that is to be subjected to the second-type physical secure erase operation, then the method may proceed back to block 1010, where the power control circuitry may supply one or more flash write voltage pulses to the wordlines of the other block. Alternatively, at block 1012, if there are no other blocks identified in the physical secure erase command, then the method 1000 may proceed to block 1014, where the erase module of the controller may determine whether to send another physical secure erase command to the die in order to subject one or more further blocks of the die to the second-type physical secure erase operation. The erase module may make the determination based on whether there are still more blocks storing host data that is to be corrupted pursuant to the received host physical secure erase command. If not, then the method 1000 may end. Alternatively, if the erase module determines to send another physical secure erase command to the die, then the method may proceed back to block 1006, where the controller issues another physical secure erase command to the die in order to subject the one or more further blocks to the second-type physical secure erase operation.

Figure 11:
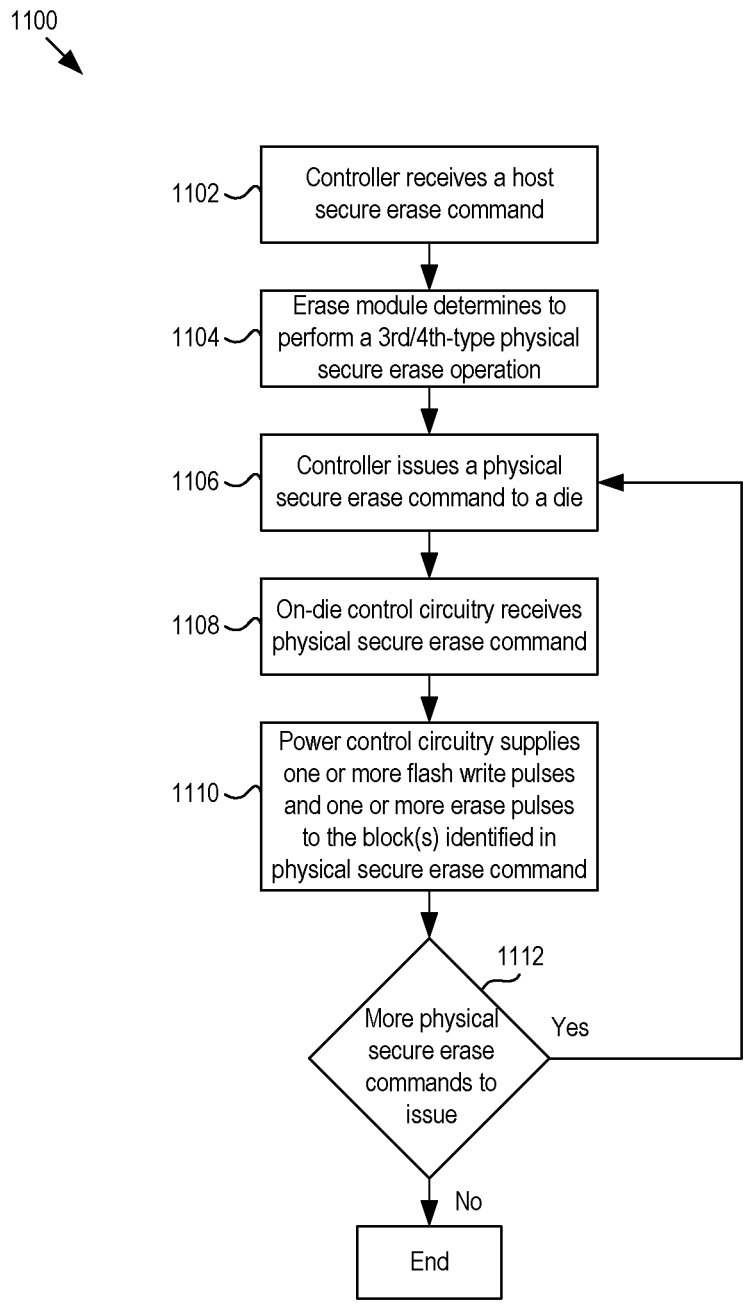
FIG. 11 is a schematic diagram of cluster sequences in the initially filtered cluster journal compilation being identified using the example method of FIG. 10.

FIG. 11 shows a flow chart of an example method 1100 of performing the third-type or fourth-type physical secure erase operation on a memory die of a non-volatile memory system, such as the non-volatile memory system described with reference to FIGS. 1-9. Although the method 1100 is described for one die, similar methods can be performed for multiple dies. At block 1102, a controller of the non-volatile memory system may receive a host secure erase command from a host system. At block 1104, the controller, such as an erase module of the controller, may determine to perform the third-type or fourth-type physical secure erase operation. At block 1106, the controller, such as with the erase module, a sequencer module, and a memory interface module, may issue a physical secure erase command to the die. The physical secure erase command may indicate to control circuitry, such as a state machine, of the die to perform the third-type or the fourth-type physical secure erase operation. The physical secure erase command may be a single command or a combination of commands, such as an erase command and a flash write command. Additionally, the physical secure erase command may also identify one or more blocks on which to perform the third-type or the fourth-type physical secure erase operation. The one or more blocks may be storing host data.

At block 1108, the control circuitry may receive the physical secure erase command from the controller. At block 1110, power control circuitry may supply one or more erase voltage pulses to the substrate and one or more flash write voltage pulses to the wordlines of the one or more blocks identified in the physical secure erase command, such as by being controlled by the control circuitry in response to receipt of the physical secure erase command. The power control circuitry may supply the one or more erase voltage pulses first and the one or more flash write voltage pulses second for the third-type physical secure erase, or may supply the one or more flash write voltage pulses first and the one or more erase voltage pulses second for the fourth-type physical secure erase. Also, each of the one or more erase voltage pulses and one or more flash write voltage pulses may be a single pulse or a plurality of pulses. If a plurality of erase pulses are supplied, the number of pulses may be fewer than the number supplied for a default erase operation such that the erase portion of the third-type or fourth-type erase operation is a fast erase operation. Additionally, the magnitude of the erase voltage pulse (or the initial erase voltage pulse if multiple pulses are supplied) may be equal to or greater than the magnitude of the initial erase voltage pulse of a default flash operation. Likewise, the magnitude of the flash write voltage pulse (or the initial flash write voltage pulse if multiple pulses are supplied) may be equal to or greater than the magnitude of the initial voltage pulse of a regular program operation. Further, if more than one block is identified in the physical secure erase command received from the controller, the power control circuitry may supply the one or more erase voltage pulses and the one or more flash write voltage pulses to the multiple blocks in various ways. In one way, the power control circuitry may not move on to a next block until it has supplied both the one or more erase voltage pulses and the one or more flash write voltage pulses to a current block. In another way, if the third-type physical secure erase operation is being performed, then the power control circuitry may supply the one or more erase voltage pulses to all of the multiple blocks before supplying the one or more flash write voltage pulses to at least one of the blocks. Alternatively, if the fourth-type physical secure erase operation is being performed, then the power control circuitry may supply the one or more flash write voltage pulses to all of the multiple blocks before supplying the one or more erase voltage pulses to at least one of the blocks. Other ways may be possible.

At block 1112, the erase module of the controller may determine whether to send another physical secure erase command to the die in order to subject one or more further blocks of the die to the third-type or the fourth-type physical secure erase operation. The erase module may make the determination based on whether there are still more blocks storing host data that is to be corrupted pursuant to the received host physical secure erase command. If not, then the method 1100 may end. Alternatively, if the erase module determines to send another physical secure erase command to the die, then the method may proceed back to block 1106, where the controller issues another physical secure erase command to the die in order to subject the one or more further blocks to the third-type or the fourth-type physical secure erase operation.

Figure 12:
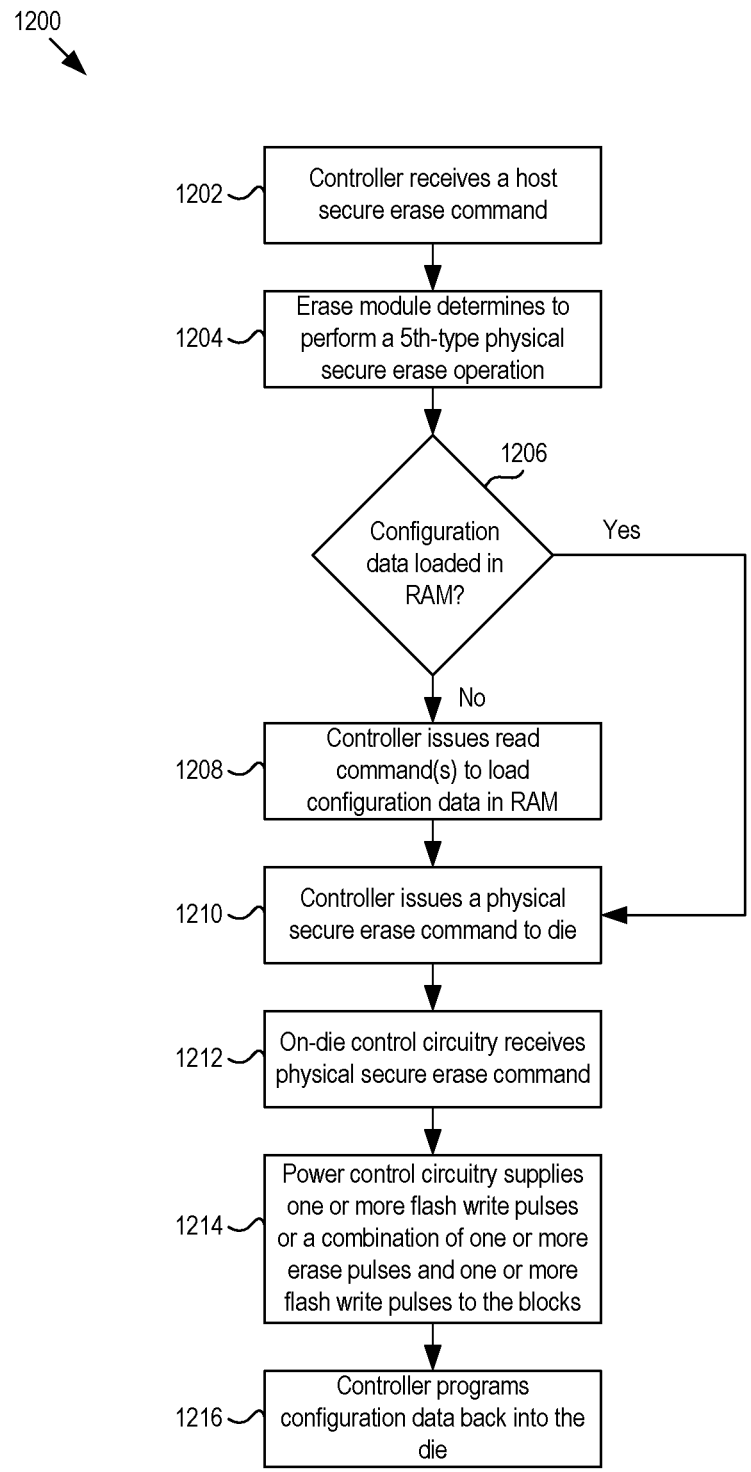
FIG. 12 is a schematic diagram illustrating cluster strings corresponding to the cluster sequences identified in FIG. 11.

FIG. 12 shows a flow chart of an example method 1200 of performing the fifth-type physical secure erase operation on a memory die of a non-volatile memory system, such as the non-volatile memory system described with reference to FIGS. 1-9. Although the method 1200 is described for one die, similar methods can be performed for multiple dies. At block 1202, a controller of the non-volatile memory system may receive a host secure erase command from a host system. At block 1204, the controller, such as an erase module of the controller, may determine to perform the fifth-type physical secure erase operation.

At block 1206, the erase module may determine whether configuration data stored on the die is loaded in RAM of the non-volatile memory system. If the erase module determines that at least some of the configuration data stored on the die is not loaded in the RAM, then at block 1208, the erase module, via a sequencer module and a memory interface of the controller, may issue one or more read commands to load the configuration data in the RAM.

At block 1210, the controller, such as with the erase module, the sequencer module, and the memory interface module, may issue a physical secure erase command to the die. The physical secure erase command may indicate to control circuitry, such as a state machine, of the die to perform the fifth-type physical secure erase operation. As previously described, the fifth-type physical secure erase operation may be the second-type, third-type, or fourth-type physical secure erase operations but performed on a "write all" basis or a combination of an "erase all" and a "write all" bases, instead of a block-by-block basis. Accordingly, the physical secure erase command issued at block 1208 may indicate to the control circuitry to perform a "write all" flash write operation, or a combination of an "erase all" erase operation and a "write all" flash write operation on the blocks of the die. The physical secure erase command may be a single command or a combination of commands, such as an "erase all" erase command and a "write all" flash write command. Referring back to block 1206, if all of the configuration data is already loaded into the RAM (or the erase module otherwise determines that it does not have to load any configuration data of the die into the RAM), then the method may proceed directly to block 1210.

At block 1212, the control circuitry may receive the physical secure erase command from the controller. At block 1214, power control circuitry may supply one or more flash write voltage pulses or a combination of one or more erase voltage pulses and one or more flash write voltage pulses to all of the blocks of the die. As previously described, the number of erase voltage pulses may be in accordance with a fast erase operation. By supplying the voltage pulses at block 1210, data being stored in all of the blocks may be corrupted, including host data and configuration data. At block 1216, the controller may program the configuration data back into the die.

Figure 13:
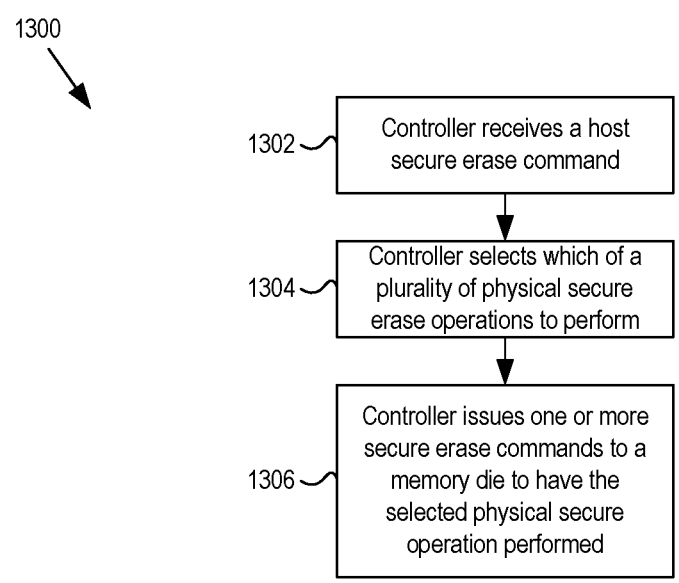
FIG. 13 is a block diagram of non-volatile memory dies configured in multiple banks and data sets associated with the cluster sequences identified in FIG. 11 being stored in the dies.

FIG. 13 is a flow chart of an example method 1300 of a controller executing one of a plurality of types of physical secure erase operations on a memory die of a non-volatile memory system, such as the non-volatile memory system described with reference to FIGS. 1-9. Although the method 1300 is described for one die, similar methods can be performed for multiple dies. At block 1302, a controller of the non-volatile memory system may receive a host secure erase command from a host system. The host secure erase command may indicate or include information used by an erase module of the controller to determine which of the plurality of physical secure erase operations to perform. As previously described, the information may expressly identify the particular physical secure operation to perform. Alternatively, the information may include performance metrics associated with the physical secure erase operations, such as level of data corruption, latency, risk of the device becoming inoperable, and/or power consumption.

At block 1304, based on the information included in the host secure erase command, the erase module may determine which of the plurality of types of physical secure erase command to perform. The types may include two or more of the first-type, second-type, third-type, fourth-type, or fifth-type, as previously described. At block 1306, upon selecting the type, the controller may issue one or more physical secure erase commands to the memory die to have the memory die perform the selected type.

Various alternatives or combinations of the methods or the different types of physical secure erase operations may be performed. For example, after the erase module selects the type of physical secure erase operation at block 1304, the selected type may be executed for a memory die in accordance with the actions performed in FIG. 10 (second type), FIG. 11 (third/fourth type), or FIG. 12 (fifth type), as appropriate. In addition or alternatively, the types of physical secure erase operations performed on different memory dies 104 in order to execute a host secure erase command may the same or different from each other. Various other alternative or combinations may be possible.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A storage system comprising:
 a memory; and
 power control circuitry that, in order to execute a host command requesting host data to be inaccessible, is configured to:
  supply one or more flash write pulses to storage locations of the memory storing the host data without supply of one or more erase pulses to the storage locations; or
  supply a combination of one or more erase pulses and one or more flash write pulses to the storage locations, wherein a number of the one or more erase pulses is less than a number of erase pulses supplied for performance of a default erase operation in the storage system.

2. The storage system of claim 1, wherein when the power control circuitry is configured to supply the one or more flash write pulses without supply of the one or more erase pulses, a sole flash write pulse or an initial flash write pulse of the one or more flash write pulses is supplied at a higher magnitude than a magnitude of an initial write pulse that the power control circuitry is configured to supply for a regular program operation.

3. The storage system of claim 2, wherein when the power control circuitry is configured to supply the one or more flash write pulses without supply of the one or more erase pulses, the one or more flash write pulses comprises the sole flash write pulse.

4. The storage system of claim 1, wherein, when the power control circuitry is configured to supply the combination of the one or more erase pulses and the one or more flash write pulses, at least one of:
 the one or more flash write pulses comprises a sole flash write pulse, or
 the one or more erase pulses comprises a sole erase pulse.

5. The storage system of claim 4, wherein both the one or more flash write pulses comprises the sole flash write pulse and the one or more erase pulses comprises the sole erase pulse.

6. The storage system of claim 1, wherein, when the power control circuitry is configured to supply the combination of the one or more erase pulses and the one or more flash write pulses, a sole erase pulse or an initial erase pulse of the one or more erase pulses is supplied at a higher magnitude than a magnitude of an initial erase pulse that the power control circuitry is configured to supply for a default erase operation.

7. The storage system of claim 1, wherein the power control circuitry is configured to supply the one or more flash write pulses without supply of the one or more erase pulses on a block-by-block basis, or supply the combination of the one or more erase pulses and the one or more flash write pulses on a block-by-block basis.

8. The storage system of claim 1, wherein the power control circuitry is configured to supply the one or more flash write pulses without supply of the one or more erase pulses on a write all basis, or supply the combination of the one or more erase pulses and the one or more flash write pulses on an erase all basis and a write all basis, respectively.

9. A storage system comprising:
 a memory; and
 power control circuitry configured to perform a default erase operation and a secure erase operation on a single unit of erase of the memory, wherein, for performance of the default erase operation, the power control circuitry is configured to supply a default number of a plurality of erase pulses, and wherein for performance of the secure erase operation, the power control circuitry is configured to supply one or more secure erase pulses that comprises a fewer number of erase pulses than the default number of the plurality of erase pulses.

10. The storage system of claim 9, wherein the one or more secure erase pulses comprises a flash write pulse and no erase pulses.

11. The storage system of claim 10, wherein the flash write pulse has a higher magnitude than a magnitude of an initial write pulse that the power control circuitry is configured to supply for a regular program operation.

12. The storage system of claim 11, wherein the flash write pulse comprises a sole flash write pulse or an initial one of a plurality of flash write pulses.

13. The storage system of claim 9, wherein the one or more secure erase pulses comprises a combination of an erase pulse and a flash write pulse.

14. The storage system of claim 13, wherein the power control circuitry is configured to supply the erase pulse at a higher magnitude than a magnitude of an initial erase pulse of the plurality of erase pulses supplied for performance of the default erase operation, and wherein the erase pulse is a sole erase pulse or an initial one of a plurality of erase pulses that the power control circuitry is configured to supply for performance of the secure erase operation.

15. The storage system of claim 9, wherein the power control circuitry is configured to perform the secure erase operation on a block-by-block basis.

16. The storage system of claim 9, wherein the power control circuitry is configured to perform the secure erase operation on an erase all basis and a write all basis.

17. A method of corrupting data in a storage system, the method comprising:
 determining, with a controller, to corrupt host data stored in a memory; and
 in response to the determination, issuing, with the controller, one or more commands to the memory to cause the memory to:
  perform a flash write operation on storage locations of the memory storing host data without performing an erase operation on the storage locations; or
  perform a combination of a flash write operation and a fast erase operation on the storage locations of the memory, wherein the fast erase operation comprises a supply of a fewer number of erase pulses than a number of erase pulses supplied for a default erase operation.

18. The method of claim 17, further comprising:
receiving, with the controller, a host secure erase command from a host system; and
selecting, with the controller, which of a plurality of different types of physical secure erase operations to perform based on information included in the host secure erase command.

19. The method of claim 17, further comprising:
in response to the one or more commands:
 supplying, with power control circuitry, a single flash write pulse to each of a plurality of blocks on a die storing host data without supply any erase pulses to the plurality of blocks; or
 supplying, with the power control circuitry, a combination of a single flash write pulse and a single erase pulse to each of the plurality of blocks on the die storing host data.

20. The method of claim 17, further comprising:
sending, with the controller, configuration data to the memory for storage in the memory after issuing the one or more commands to the memory.

21. A storage system comprising:
a memory; and
means for performing a default erase operation and a secure erase operation on a single unit of erase of the memory, wherein the means supplies a default number of a plurality of erase pulses for performance of the default erase operation and supplies a fewer number of erase pulses than the default number of the plurality of erase pulses for performance of the secure erase operation.

* * * * *